(12) United States Patent
Green

(10) Patent No.: US 7,307,334 B2
(45) Date of Patent: Dec. 11, 2007

(54) INTEGRATED CIRCUIT HAVING FEATURES TO LIMIT SUBSTRATE CURRENT

(75) Inventor: Brian D. Green, Austin, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/902,233

(22) Filed: Jul. 29, 2004

(65) Prior Publication Data

US 2006/0022296 A1 Feb. 2, 2006

(51) Int. Cl.
 *H01L 31/113* (2006.01)
(52) U.S. Cl. .......................... 257/532; 363/20
(58) Field of Classification Search ............ 257/501, 257/516, 532
 See application file for complete search history.

(56) References Cited

U.S. PATENT DOCUMENTS 6,914,791 B1\* 7/2005 Park et al. .................. 363/60
2004/0079999 A1\* 4/2004 Shibata et al. .............. 257/371

FOREIGN PATENT DOCUMENTS

WO WO-02052649 A1 \* 4/2002

\* cited by examiner

*Primary Examiner*—Thomas L. Dickey
(74) *Attorney, Agent, or Firm*—Peter Zawilski

(57) ABSTRACT

A technique includes forming a first well in a substrate and forming a second well in the substrate. The first well is electrically isolated from the second well. The technique includes forming an element in the second well to limit current between the first well and the substrate.

15 Claims, 6 Drawing Sheets

INTEGRATED CIRCUIT HAVING FEATURES TO LIMIT SUBSTRATE CURRENT

BACKGROUND

The invention generally relates to an integrated circuit that has features to limit substrate current.

The operation of an integrated digital circuit may produce electrical activity that spans a wide frequency spectrum, including the radio frequency (RF) range. This high frequency electrical activity, such as the electrical activity in the RF range, has a tendency to generate a significant level of substrate current if no measures are taken to limit this current. To understand the origin of the substrate current, the digital circuit may be viewed as performing simple capacitive charge redistribution between loads that are being switched.

For example, FIG. 1 depicts an exemplary model 10 of a digital circuit, illustrating the current flows due to the switching of capacitive loads. More specifically, the model 10 includes switches 12 and 14 that couple respective capacitors 13 and 15 between a local supply voltage (called "$V_{DD}$") and a local ground 20. The capacitors 13 and 15 may represent the parasitic capacitances that are coupled to the switches. For example, if the switches 12 and 14 are implemented by metal oxide semiconductor field-effect-transistor (MOSFET) devices, then the capacitors 13 and 15 represent the load capacitances of these devices, such as parasitic device capacitances, capacitances of loads that are coupled to the devices, line capacitances, etc.

For purposes of controlling DC substrate currents, the switching devices of the integrated circuit typically are formed inside an n donor-type region (called a "deep n-well") of a p donor-type substrate to provide a degree of isolation between the devices and the substrate. If high frequency electrical activity (electrical activity in the RF range or higher, for example) is present, however, a significant high frequency current path may develop between the deep n-well and the substrate. This current path, attributable to a parasitic capacitance that exists between the deep n-well and the substrate, is represented in FIG. 1 by a capacitor 24 that is coupled between the $V_{DD}$ local supply voltage and a substrate ground 26.

During a switching event, high frequency current flows in controlled current loops that are formed by the capacitors 13 and 15 and the switches 12 and 14. Also, current flows in less well-controlled loops that are formed by the capacitor 24. Thus, as depicted in FIG. 1, a substrate current flows through a current path 28 that exists between the substrate ground 26 and the local ground 20.

The substrate current typically presents challenges in that the current may cause interference with the operation of other unrelated circuits on the same semiconductor package that contains the digital circuit. Furthermore, the substrate current may introduce interference elsewhere in a system that incorporates the semiconductor package.

In an attempt to reduce the substrate current that is attributable to the high frequency electrical activity, a conventional digital circuit may include explicit bypass capacitors (collectively represented by a bypass capacitor 30 in FIG. 1) that are coupled between the $V_{DD}$ local supply voltage and the local ground 20. Neglecting resistive and inductive effects, the high frequency currents split between the loops containing the capacitor 24 and the loops containing the capacitor 30 according to the ratio of their respective capacitances. For example, if the capacitance of the capacitor 24 is approximately one tenth of the sum of the capacitance of the capacitors 24 and 30, then about ten percent of the high frequency current will flow through the poorly-controlled path 28 that includes the capacitor 24.

From this perspective, the risk of substrate current causing interference may be reduced by increasing the ratio of the capacitance of the capacitor 30 to the capacitance of the capacitor 24. However, challenges may arise in this type of compensation scheme in that by increasing the size of the bypass capacitor 30, the size of the deep n-well also increases. It follows that increasing the size of the deep n-well increases the area of contact between the deep n-well and the substrate, thereby also increasing the size of the capacitor 24. Therefore, there is a limit to this type of substrate current compensation.

Thus, there is a continuing need for better ways to limit a substrate current in an integrated circuit.

SUMMARY

In an embodiment of the invention, a technique includes forming a first well in a substrate and forming a second well in the substrate. The first well is electrically isolated from the second well. The technique includes forming an element in the second well to limit current between the first well and the substrate.

In another embodiment of the invention, an integrated circuit includes a substrate, a first well, a second well and an element. The first well is formed in the substrate, and the second well is formed in the substrate and is electrically isolated from the first well. The element is located in the second well to limit a current between the first well and the substrate.

In another embodiment of the invention, a system includes a wireless interface, a substrate, a first well formed in the substrate, a second well formed in the substrate, an element and a circuit. The second well is electrically isolated from the first well, and the element is located in the second well to limit a current between the first well and the substrate. The circuit is disposed in the first well to process a signal that is associated with the wireless interface.

In yet another embodiment of the invention, a technique includes electrically isolating a first well of a semiconductor substrate from a second well of the substrate. The technique includes using an element in the second well to suppress a current between the first well and the substrate.

Advantages and other features of the invention will become apparent from the following description, drawing and claims.

DETAILED DESCRIPTION

Figure 2:
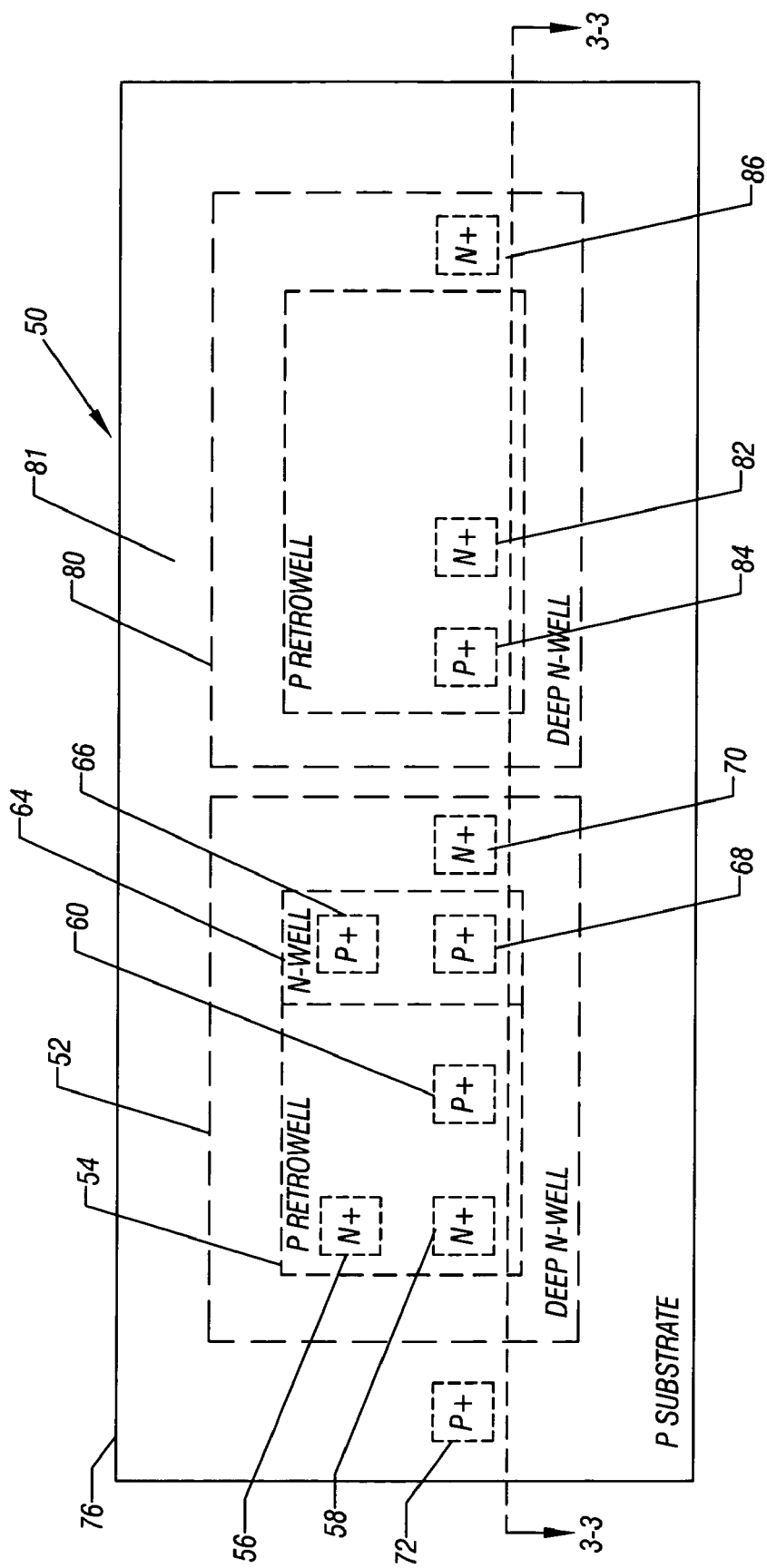
FIG. 2 is a top view of an exemplary integrated circuit according to an embodiment of the invention.

Referring to FIG. 2, an embodiment of an integrated circuit 50 in accordance with the invention includes an n donor-type region (called "a deep n-well 52"), that is formed (through implantation or diffusion, for example) in a p donor-type substrate 76 (called a "p substrate 76" herein) of the circuit 50. The deep n-well 52 contains various circuit components, such as, for example, digital circuits that have electrical activity that extends into the radio frequency (RF) range or higher. If not properly compensated, this high frequency electrical activity may generate a significant level of substrate current that, in turn, may introduce noise and disrupt operation of other circuitry of the integrated circuit as well as the larger system that contains the integrated circuit. As described below, unlike conventional integrated circuits, the integrated circuit 50 contains features to limit the substrate current while minimizing the area of contact between the deep n-well 52 and the p substrate 76.

The circuit components that are disposed in the deep n-well 52 may be formed in a complementary metal-oxide-semiconductor (CMOS) process (in some embodiments of the invention) and thus, may include a number of metal-oxide-semiconductor field-effect-transistors (MOSFETs). As an example, FIG. 2 depicts an n-channel MOSFET (one of many possible n-channel MOSFETs) that has n+ doped drain and source regions 56 and 58, respectively. These regions 56 and 58 may be formed in a p-type retro well 54 that, in turn, is formed in the deep n-well 52. The retro well 54 may also contain, for example, additional transistors as well as one or more p+ doped regions 60 for purposes of establishing electrical contact with the p retro well 54. The deep n-well 52 may also include, for example, a p-channel MOSFET (one of many potential p-channel MOSFETs of the integrated circuit 50) that is formed in an n-well 64 that is disposed in the deep n-well 52. For example, a p-channel MOSFET may include drain 66 and source 68 p+ type doped regions, respectively.

As also depicted in FIG. 2, the deep n-well 52 may include n+ regions, such as region 70, to form electrical contacts with the deep n-well 52 using metal layer connections (none depicted in FIG. 2) in the circuit 50.

For purposes of minimizing or even preventing substrate current between the deep n-well 52 and the p substrate 76, in some embodiments of the invention, the integrated circuit 50 includes capacitance that is formed in a deep n-well 80, a well that is physically and electrically isolated from the deep n-well 52. As described further below, the capacitance is electrically coupled to a local supply voltage that provides power to the electrical components that are disposed in the deep n-well 52.

Due to the electrical isolation of the deep n-wells 52 and 80, the contact area between the p substrate 76 and the deep n-well 52 is not a function of the size of the capacitance in the deep n-well 80, thereby overcoming the limit that is imposed by conventional substrate current compensation techniques. Thus, the size of the deep n-well 52 is controlled by the size of well that is needed to contain the circuit components that are not necessarily used to limit the substrate current and is not affected by the size of the deep n-well 80.

The deep n-well 80 is formed in the p substrate 76 and contains capacitive elements to, through charge sharing, reduce or even eliminate the substrate current flowing from the deep n-well 52. As depicted in FIG. 2, in some embodiments of the invention, the deep n-well 80 may include various electrical contact regions, such as an n+ contact region 86, to establish electrical contact between the n-well 80 and a supply voltage. The deep n-well 80 includes a p-type retro well 81 that is formed in the deep n-well 80. This p retro well 81 may include, for example, an n+ region 82 that serves to form a capacitor (a MOSFFET capacitor, for example) for purposes of limiting substrate current between the deep n-well and the p substrate 76. The retro well 81 may also include various contact regions, such as the depicted p+ type region 84 for purposes of establishing electrical contact with the p retro well 81.

Figure 3:
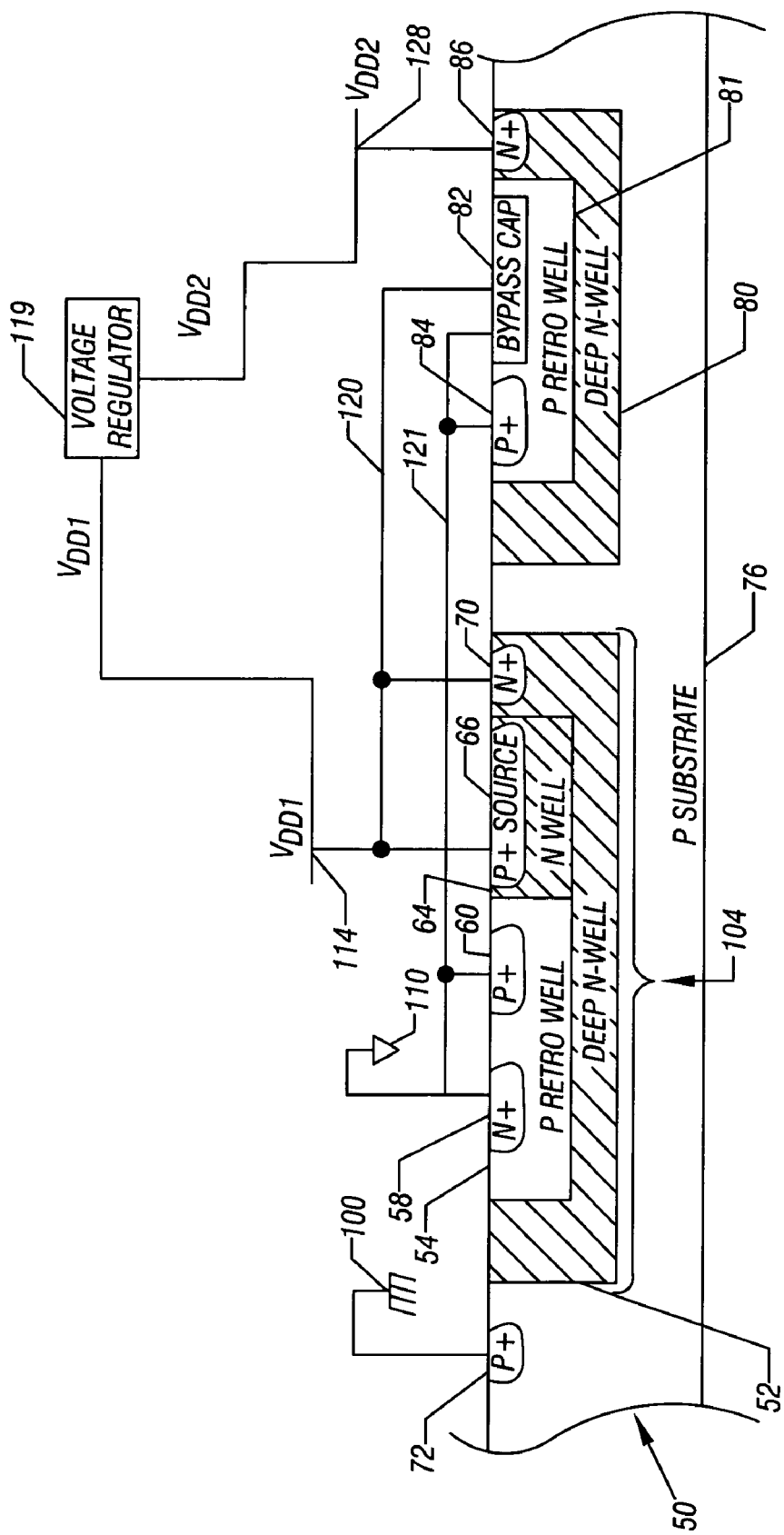
FIG. 3 is a cross-sectional view taken along line 3-3 of FIG. 2 according to an embodiment of the invention.

Referring to FIG. 3, in accordance with some embodiments of the invention, the integrated circuit 50 may have the following electrical connections. In particular, the components that are disposed in the deep n-well 52 may be coupled to a local ground 110 and a local supply voltage (called "$V_{DD1}$") that supplies power to the components that are disposed in the deep n-well 52. Thus, more specifically, the p+ region 60 and the n+ region 58 may be coupled to the local ground 110; and the p+ region 66 and the n+ region 70 may be coupled to the $V_{DD1}$ local supply voltage.

As depicted in FIG. 3, the compensating electrical components in the deep n-well 80 are connected either to the local ground 110 or to a separate, second supply voltage called $V_{DD2}$. More specifically, as depicted in FIG. 3, the n+ region 86 and thus, the deep n-well 80, are connected to the $V_{DD2}$ supply voltage. The p+ region 84 and the bypass capacitor region 82 are connected to the local ground 110. Furthermore, another terminal of the bypass capacitor region 82 is coupled to the $V_{DD1}$ supply voltage.

Thus, as can be seen, the deep n-well 80 is connected to the $V_{DD2}$ supply voltage, a voltage that may contain significantly less noise (i.e., the $V_{DD2}$ supply voltage may be a "quiet" supply voltage) than the $V_{DD1}$ supply voltage, in some embodiments of the invention. In some embodiments of the invention, the $V_{DD1}$ and $V_{DD2}$ supply voltages may be furnished by a voltage regulator 119. The voltage regulator 119 suppresses any RF electrical activity that is present on the conductive line(s) that supply the $V_{DD1}$ supply voltage from propagating to the conductive line(s) that supply the $V_{DD2}$ supply voltage.

Due to the above-described arrangement, the contact area between the deep n-well 52 and the p substrate 76 is minimized as far as possible in that explicit bypass capacitance is built into a separate deep n-well that is connected to a quiet supply voltage. This allows increasing the ratio of the capacitance in the deep n-well 80 to the parasitic substrate capacitance to any value without limit (in principal) to suppress substrate current to any desired level (in principal).

In some embodiments of the invention, connections 121 between the components in the deep n-well and the local ground 110 have a minimal resistance; and likewise, connections 120 between components in the deep n-well 80 and the $V_{DD1}$ supply voltage have minimal resistance. More specifically, in some embodiments of the invention, the connections use several interconnected metal layers (six metal layers, for example) for purposes of minimizing the resistances of these interconnection paths. For example, for these connections, each metal layer may be a grid, and the grids may be connected together by vias that extend between the layers. Although reducing the resistance in this manner may introduce additional capacitance, this capacitance compensates the substrate current and is thus, desirable.

Figure 4:
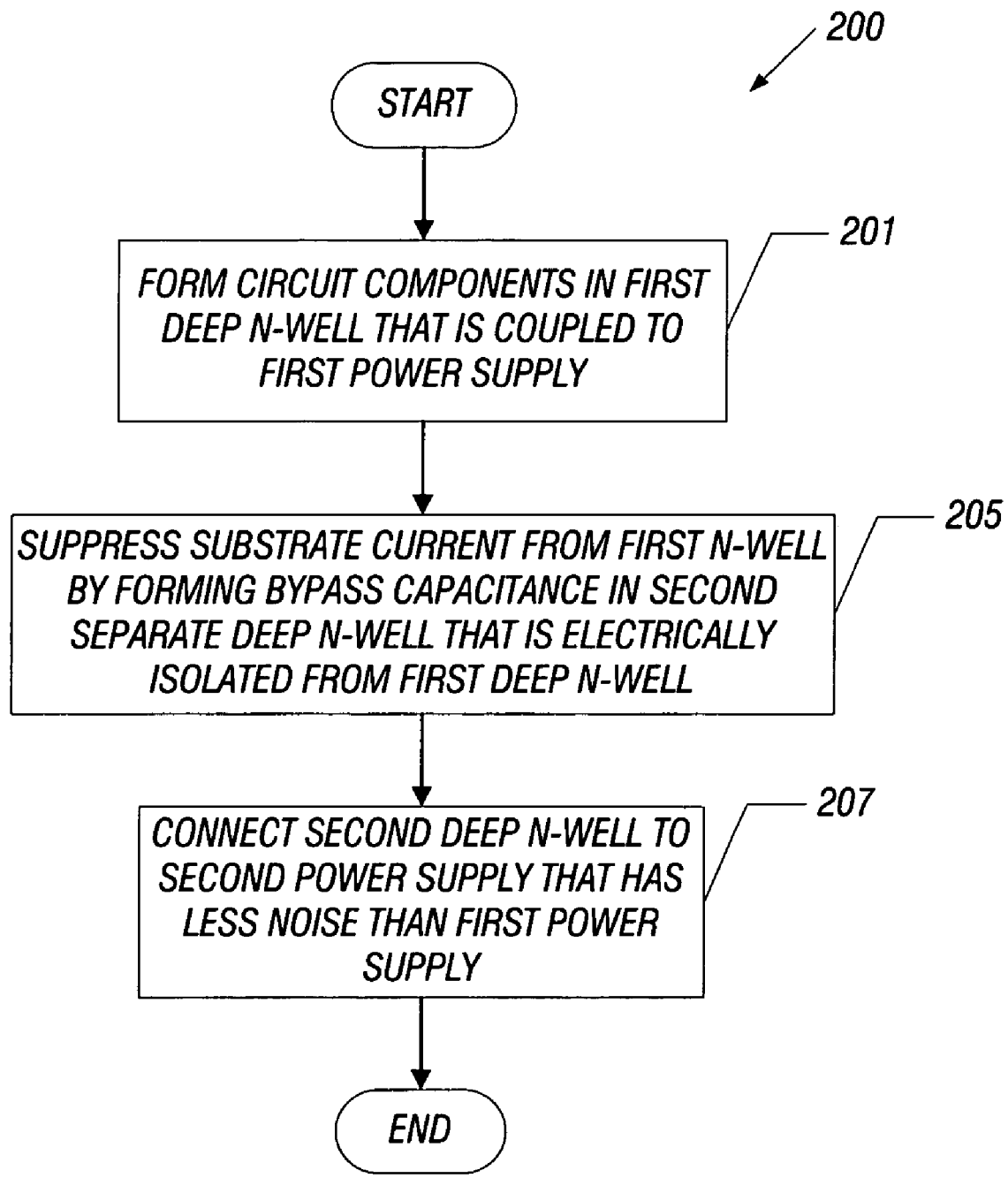
FIG. 4 is a flow diagram depicting a technique to limit substrate current according to an embodiment of the invention.

Thus, referring to FIG. 4, in accordance with some embodiments of the invention, a technique 200 includes forming (block 201) circuit components in a first deep n-well that is connected to a first power supply. The technique 200 includes limiting or suppressing (block 205)

substrate current from the first deep n-well to the substrate by forming bypass capacitance in a second deep n-well that is electrically isolated and separate from the first deep n-well. The technique 200 also includes connecting the second deep n-well to a second power supply that has less noise than the first power supply, as depicted in block 207.

Figure 5:
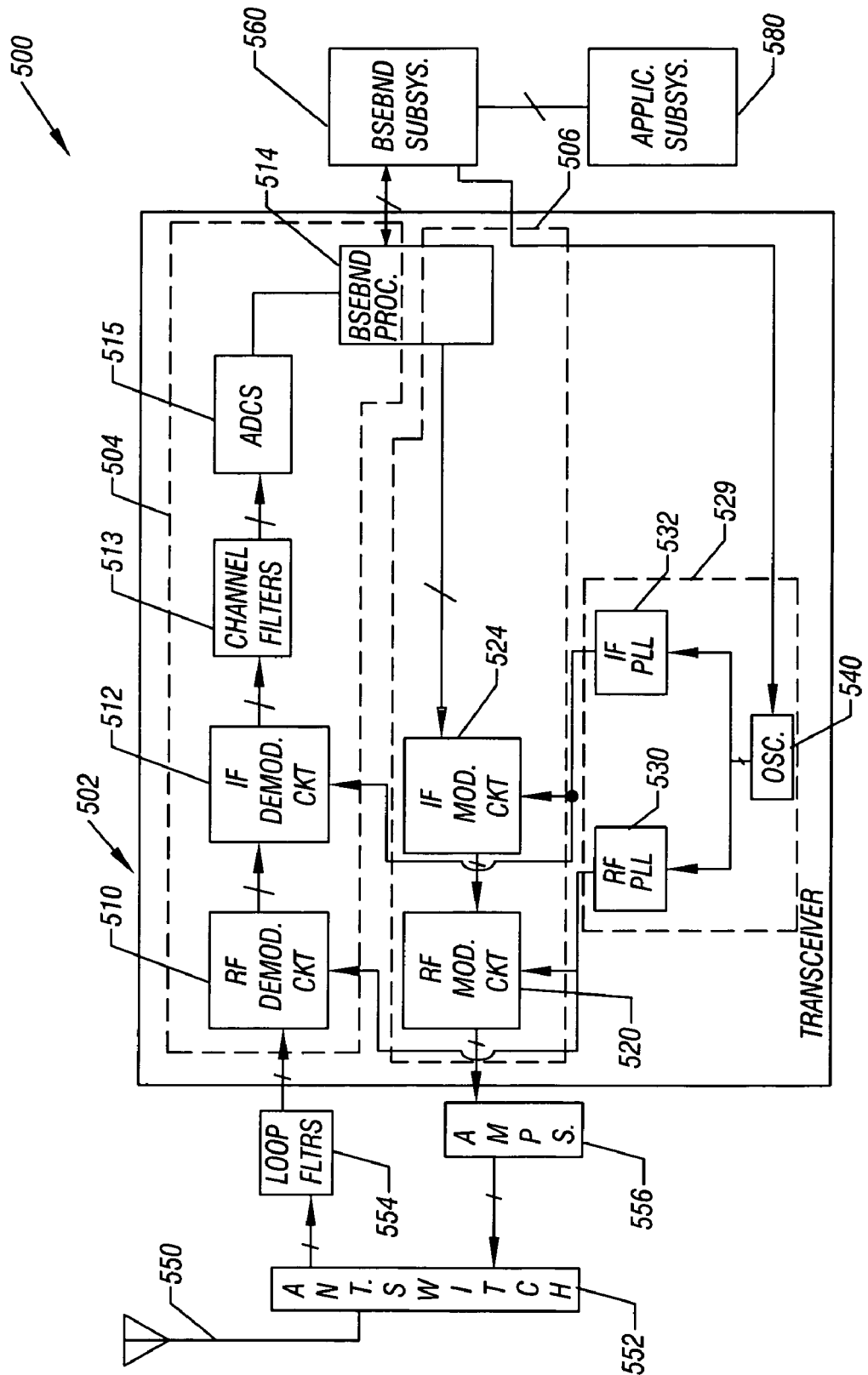
FIG. 5 is a schematic diagram of a wireless system according to an embodiment of the invention.

Referring to FIG. 5, in some embodiments of the invention, the substrate current suppression technique disclosed herein may be used in an integrated circuit that contains digital circuitry, the operation of which is the source of electrical activity in the RF range or higher. More specifically, in an embodiment of the invention, the technique may be used in connection with a wireless system 500. The wireless system 500 may be a cellular telephone, a personal digital assistant (PDA) with wireless capability, as just a few examples.

More specifically, the wireless system 500 may include an RF transceiver 502 that is part of a semiconductor package (or "chip"), in some embodiments of the invention. The transceiver 502 may be fabricated on one or more dies, depending on the particular embodiment of the invention.

The transceiver 502 includes receive circuitry 504 and transmit circuitry 506. The receive circuitry 504 may include, for example, an RF demodulation circuit 510 for purposes of receiving RF wireless signals associated with one or more wireless standards (GSM, DCS and PCS standards, as examples) and demodulating the signals to produce intermediate frequency signals that are processed by an intermediate frequency (IF) demodulation circuit 512 of the receive circuitry 504. The IF demodulation circuit 512 provides demodulated signals to channel filters 513 that separate the signals based on frequency so that analog-to-digital converters (ADCs) 515 may convert these signals into digital signals that are processed by a baseband processor 514 of the transceiver 502.

The baseband processor 514, in some embodiments of the invention, is a digital signal processor that is fabricated in a particular semiconductor die. The die includes various digital components that are fabricated in a deep n-well that is physically and electrically separate from another deep n-well. This other deep n-well is used for purposes of suppressing or limiting the substrate current and thus, contains the substrate current limiting features that are described above. As examples, the baseband processor 514 may perform such functions as channel filtering, removal of quantization noise, image reject compensation, offset calibration, etc., all of which may be associated with the receive path of the transceiver 502. In some embodiments of the invention, other digital components (such as a counter, frequency synthesizer, etc.) of the wireless system 500 may be fabricated in the same or different deep n-well as the baseband processor 514. Capacitive substrate current from the deep n-well containing these components may be compensated by capacitive elements located in another deep n-well that is physically separate and electrically isolated from the deep n-well that contains these digital components, as described herein.

In some embodiments of the invention, the transmit circuit 506 includes an IF modulation circuit 524 for purposes of modulating data to an intermediate frequency. An RF modulation circuit 520 (of the transmit circuit 506) further modulates the signals to the appropriate RF frequencies, pursuant to the particular communication standard being used for transmission.

The baseband processor 514 is an example of a component that may be shared by both the receive 504 and transmit 506 circuits of the integrated circuit 50. As another example, the transceiver 502 may include clock circuitry 329 that includes an RF phase locked loop (PLL) 530 and an IF PLL 532. The PLLs 530 and 532 produce RF and IF signals, respectively, in response to a reference frequency that is provided by an oscillator 540 of the RF transceiver 502.

Among its other features, in some embodiments of the invention, the wireless system 500 may also include various amplifiers 556 for purposes of amplifying the signals to be provided to an antenna 550 and loop filters 554 for purposes of filtering the signal provided by the antenna 550 to produce filtered signals that are received by the receive circuit 504. Additionally, the wireless system 500 may include, for example, an antenna switch 552 for purposes of controlling the antenna 550 depending on the particular standard being used. Furthermore, the wireless system 500 may include a baseband subsystem 560 that is coupled to the transceiver 502 for purposes of encoding and decoding data for purposes of implementing the specific wireless standard. The baseband subsystem 509 may be coupled to, for example, an application subsystem 580.

The application subsystem 580 may include various input devices, such as a keypad and an output device, such as a display, for purposes of forming an interface with a user of the wireless system 500. Furthermore, the application subsystem 580 may execute various application programs for purposes of interfacing with a user of the wireless system 500.

The wireless system 500, as well as the transceiver 502, illustrate only a few out of the many possible embodiments of circuitry that may employ the substrate current suppression technique that is disclosed herein.

Figure 1:
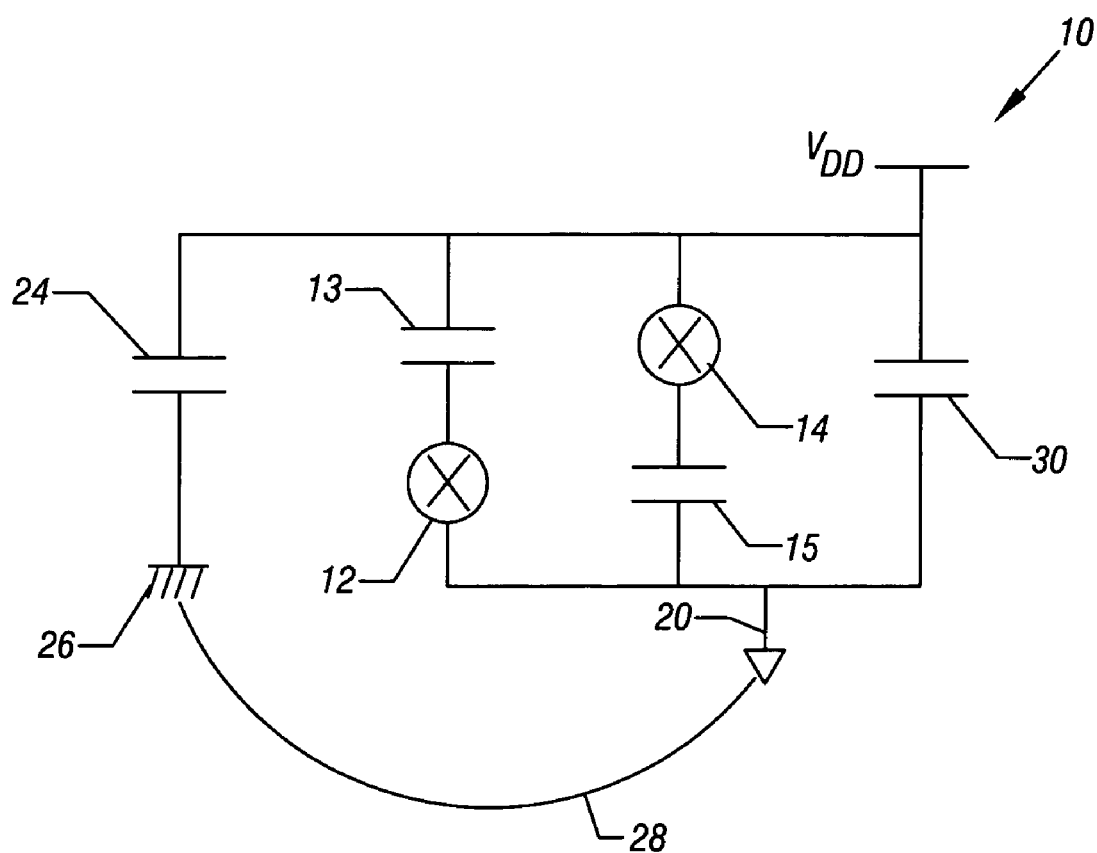
FIG. 1 is a schematic diagram of an integrated circuit of the prior art depicting substrate current flow.
Figure 6:
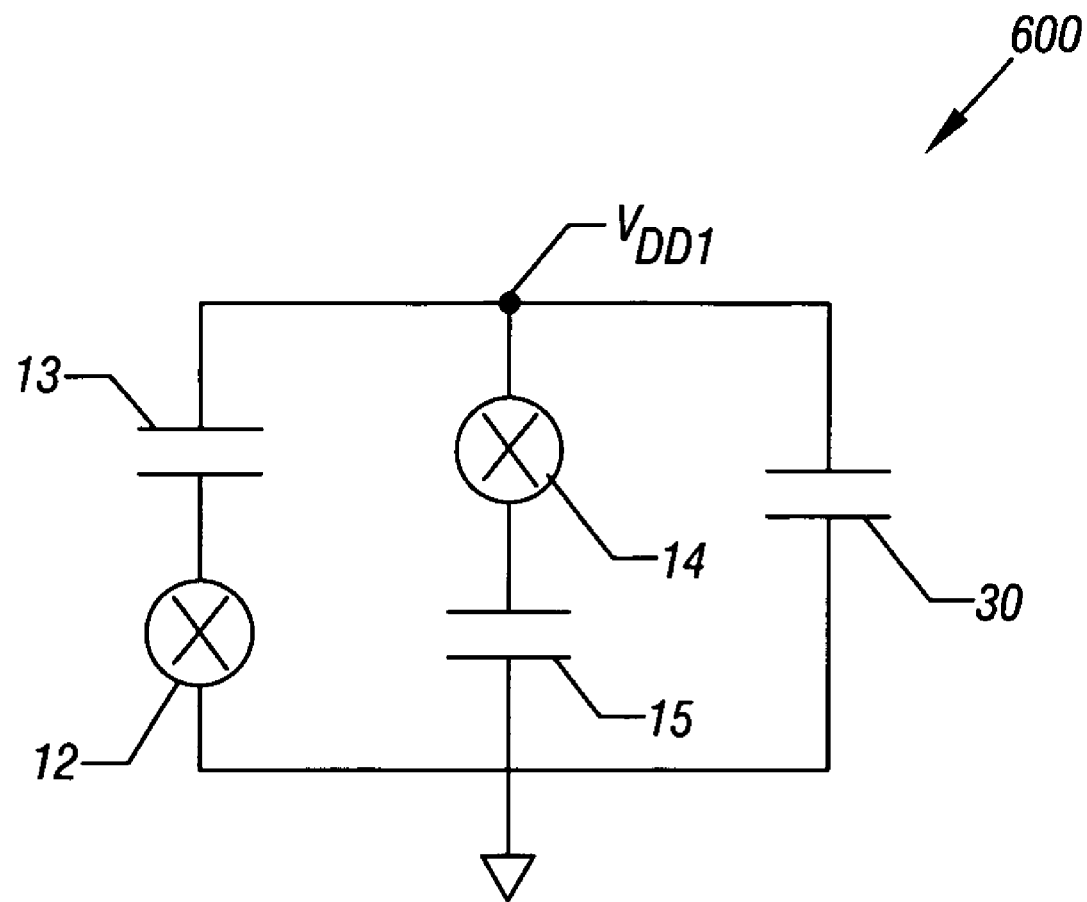
FIG. 6 is a schematic diagram of an integrated circuit according to an embodiment of the invention.

Referring to FIG. 6, thus, in accordance with at least some embodiments of the invention, an integrated circuit may be represented by an exemplary model 600. The model 600 is similar to the model 10 (FIG. 1), with the exception that the capacitor 24 (FIG. 1) and current path 28 (FIG. 1) are not shown as part of the model 600 because the capacitance between the substrate and the supply voltage may be relatively insignificant, as compared to the capacitance of the capacitor 30. Thus, because the current flowing through the capacitor 24 (FIG. 1) may be reduced to the point of irrelevance, the resulting circuit may be approximated as depicted in FIG. 6.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. An integrated circuit comprising:
   a substrate
   a first well formed in the substrate;
   a second well formed in the substrate and electrically isolated from the first well;
   a bypass capacitor located in the second well to be directly connected between a first power supply that provides power to circuit components and that is coupled to the first well and ground to limit a current between the first well and the substrate.

2. The integrated circuit of claim 1, wherein a second power supply separate from the first power supply is coupled to the second well.

3. The integrated circuit of claim 2, wherein the second power supply has significantly less noise than the first power supply.

4. The integrated circuit of claim 2, wherein the second well is not coupled to the first power supply voltage.

5. The integrated circuit of claim 1, wherein the first well comprises a deep n-well.

6. The integrated circuit of claim 1, wherein the second well comprises a deep n-well.

7. The integrated circuit of claim 1, wherein:
the first well comprises a deep n-well; and
the second well comprises a deep n-well.

8. An integrated circuit comprising:
a substrate;
a first well formed in the substrate and comprising circuitry powered by a first supply voltage;
a second well formed in the substrate and electrically isolated from the first well, the second well being coupled to a second supply voltage which is not coupled to the circuitry of the first well; and
an element located in the second well to limit a current between the first well and the substrate.

9. The integrated circuit of claim 8, further comprising:
an isolation circuit to isolate noise present on the first supply voltage from the second supply voltage.

10. The integrated circuit of claim 9, wherein the isolation circuit comprises a power supply.

11. The integrated circuit of claim 9, wherein the isolation circuit is adapted to suppress radio frequency energy generated by the circuitry of the first well from propagating to the second supply voltage.

12. The integrated circuit of claim 8, wherein the element comprises a capacitor coupled between the first supply voltage and ground.

13. The integrated circuit of claim 8, wherein the first well comprises a deep n-well.

14. The integrated circuit of claim 8, wherein the second well comprises a deep n-well.

15. The integrated circuit of claim 8, wherein the second n-well contains no circuitry that receives the first supply voltage.

* * * * *